United States Patent [19]

Arimoto

[11] Patent Number: 5,082,798
[45] Date of Patent: Jan. 21, 1992

[54] CRYSTAL GROWTH METHOD

[75] Inventor: Satoshi Arimoto, Itami, Japan

[73] Assignee: Mitsubishi Denki Kabushiki Kaisha, Japan

[21] Appl. No.: 588,808

[22] Filed: Sep. 27, 1990

[30] Foreign Application Priority Data

Apr. 18, 1990 [JP] Japan .................................. 2-102634

[51] Int. Cl.$^5$ ............................................ H01L 21/20
[52] U.S. Cl. .................................... 437/108; 437/107; 437/110; 437/81; 156/610; 156/613
[58] Field of Search ................. 437/107, 108, 110, 81; 156/610, 613

[56]  References Cited

U.S. PATENT DOCUMENTS

| 4,592,791 | 6/1986 | Nakajima et al. | 437/119 |
| 4,767,494 | 8/1988 | Kobayashi et al. | 437/110 |
| 4,840,921 | 6/1989 | Matsumoto | 437/89 |
| 4,845,049 | 7/1989 | Sunakawa | 437/81 |
| 4,859,627 | 8/1989 | Sunakawa | 437/81 |

OTHER PUBLICATIONS

Razeghi et al., "Monolayer Epitaxy of III-V Compounds by Low-Pressure Metalorganic Chemical Vapor Dep.", Appl. Phys. Lett. 51(26), Dec. 28, 1987, pp. 2216-2218.
Mori et al., "GaAs Growth by Atomic Layer Epitaxy Using Diethylgalliumchloride," Appl. Phys. Lett. (1), Jan. 4, 1988, pp. 27-29.
Doi et al., "Stepwise Monolayer Growth of GaAs by Switched Laser Metalorganic Vapor Phase Epitaxy," Appl. Phys. Lett. 49 (13), Sep. 29, 1986, pp. 785-787.
Aoyagi et al., "Atomic-Layer Growth of GaAs by Modulated-Continuous Wave Laser Metalorganic Vapor Phase Epitaxy", J. Vac. Sci. Technol. B5(5); Sep./Oct. 1987, pp. 1460-1464.
Nishizawa, "Molecular Layer Epitaxy", Journal of the Electrochemical Society, vol. 132, No. 5, 1984, pp. 1197-1200.
Horikoshi et al., "Low-Temperature Growth ... Beam Epitaxy", Japanese Journal of Applied Physics, vol. 25, No. 10, 1984, pp. L868-L870.

Primary Examiner—Brian E. Hearn
Assistant Examiner—Kevin Picardat
Attorney, Agent, or Firm—Leydig, Voit & Mayer

[57]  ABSTRACT

A crystal growth method using an atomic layer epitaxial growth method for growing a III-V compound semiconductor by metal organic chemical deposition in which group III and group V elements are supplied independently including doping with a group IV element as an amphoteric impurity by alternatingly epitaxially growing one atomic layer including the group IV element and one of the group III and group V elements and epitaxially growing one atomic layer of the other of the group III and V elements.

9 Claims, 3 Drawing Sheets

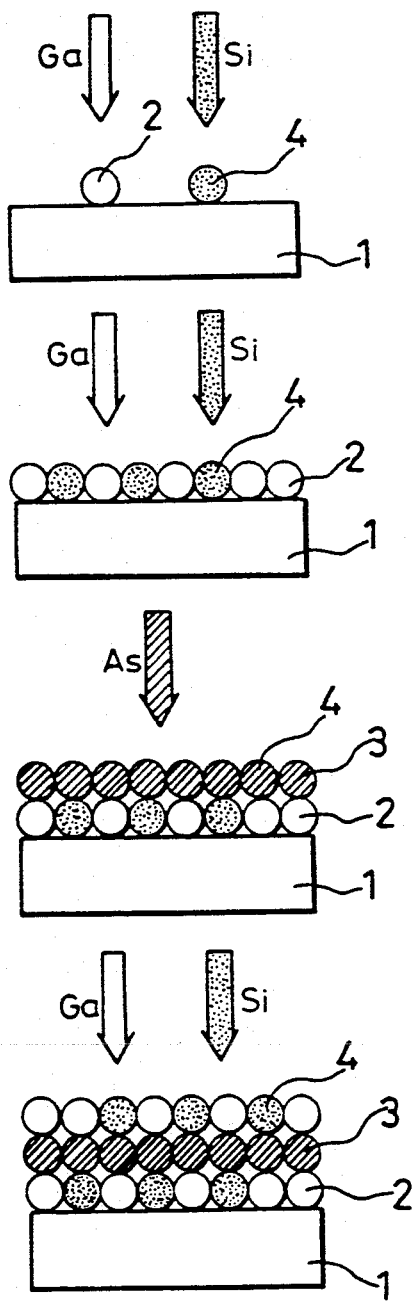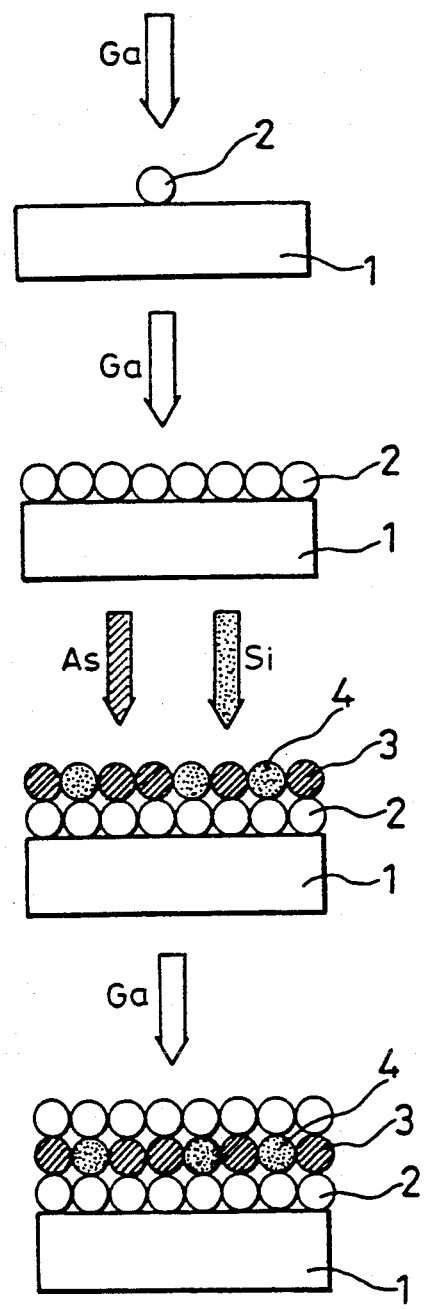

CRYSTAL GROWTH METHOD

FIELD OF THE INVENTION

The present invention relates to an epitaxial growth method for III-V compound semiconductors utilizing MOCVD method, and more particularly to an epitaxial growth method that controls arbitrarily the lattice position into which a IV group element which is an amphoteric impurity is taken in.

BACKGROUND OF THE INVENTION

FIGS. 3(a) and 3(b) are schematic diagrams showing a conventional process of epitaxial growth of GaAs by MOCVD. In FIGS. 3(a) and 3(b), reference numeral 1 designates a GaAs substrate, reference numeral 2 designates Ga atoms, reference numeral 3 designates As atoms, and reference numeral 4 designates Si atoms. In the MOCVD method, trimethylgallium (TMG) is used as a source of Ga and arsine ($AsH_3$) is used as a source of As. When Si is used as a dopant, silane ($SiH_4$) is used.

FIG. 3(a) shows a growth process without dopant impurities and a three-dimensional growth in which Ga atoms and As atoms are alternately deposited is carried out.

FIG. 3(b) shows a growth process Si atom 4 is a dopant impurity. In this case, impurity element Si is supplied at the same time when main elements Ga and As for constituting a crystal are supplied, whereby the electric conductivity of crystal, that is, n type or p type is controlled.

In the prior art crystal growth method constituted as described above, the main element and the impurity are supplied at the same time thereby to control the electrical conductivity type. When IV group element is supplied as impurity in a III-V compound semiconductor, Si as a IV group element replaces either Ga atom as III group element or As atom as V group element as shown in FIG. 3(b). In the former case, Si behaves as a dopant showing n type conductivity (generally called a "donor") and in the latter case, Si behaves as a dopant showing p type conductivity (generally called an "acceptor"). In other words, Si behaves as an amphoteric impurity. In the MOCVD method, however, doping with Si produces n type conductivity and even doping with Ge which is also IV group element produces n type conductivity. In this way, in the supply of impurities in the prior art crystal growth method, although the impurity is an amphoteric impurity, the conductivity type is determined unconditionally and doping control sufficiently utilizing the properties of the impurity is not achieved.

SUMMARY OF THE INVENTION

It is an object of the present invention to provide a crystal growth method that enables incorporating an amphoteric impurity into a crystal as a donor or acceptor.

Other objects and advantages of the present invention will become apparent from the detailed description given hereinafter; it should be understood, however, that the detailed description and specific embodiment are given by way of illustration only, since various changes and modifications within the spirit and the scope of the invention will become apparent to those skilled in the art from this detailed description.

In accordance with the present invention, doping with a IV group element as an amphoteric impurity in a III-V group compound semiconductor in MOCVD comprises a process of epitaxially growing one atomic layer of a IV group element and one of a III group element and a V group element and a process of epitaxially growing one atomic layer of the other of the III group element and the V group element. Therefore, the lattice position in the crystal into which IV group element as an amphoteric impurity is placed can be arbitrarily and selectively controlled to the side of III group element or to the side of the V group element, and control of n conductivity type or p conductivity type can be reliably performed.

BRIEF DESCRIPTION OF THE DRAWINGS

FIGS. 1(a) and 1(b) are schematic diagrams showing a mechanism of crystal growth method in accordance with an embodiment of the present invention;

DETAILED DESCRIPTION OF THE PREFERRED EMBODIMENTS

An embodiment of the present invention will be described in detail with reference to the drawings.

Figure 3A:
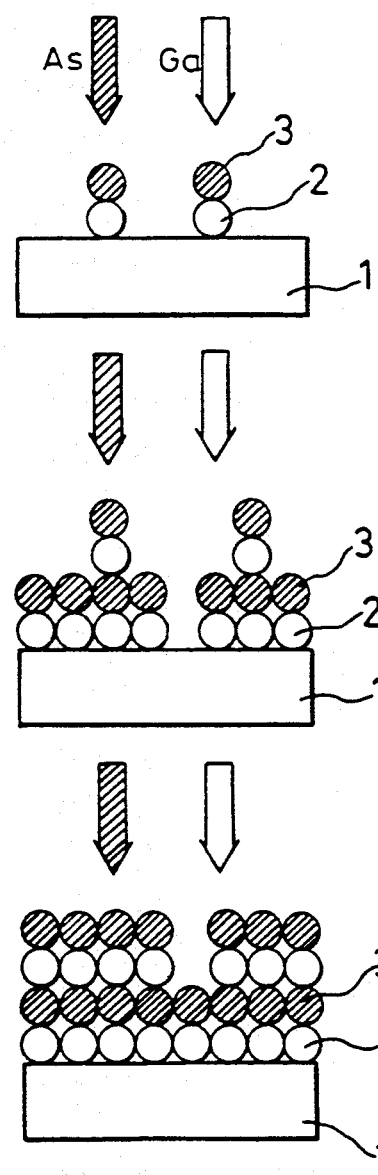
FIGS. 3(a) and 3(b) are schematic diagrams showing a mechanism of a prior art crystal growth method.
Figure 3B:
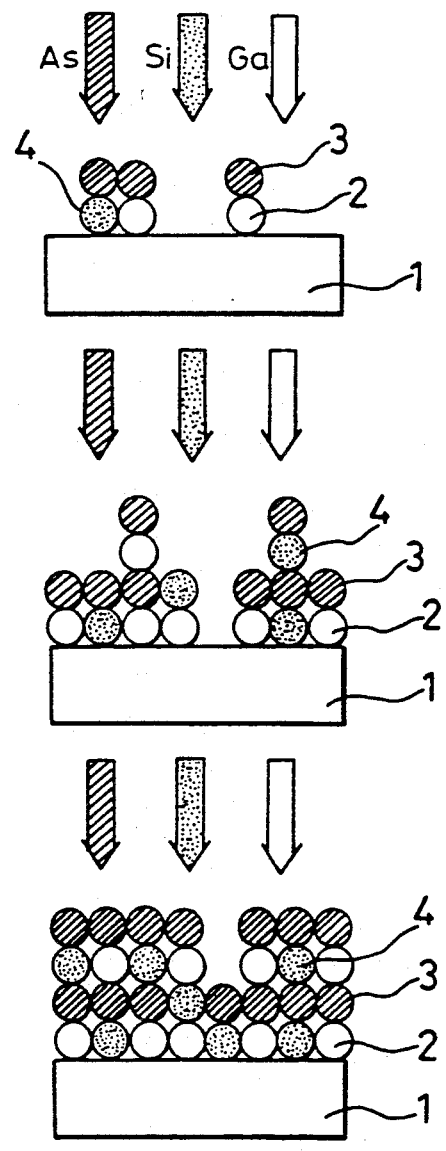

FIGS. 1(a) and 1(b) are schematic diagrams showing crystal growth methods in accordance with an embodiment of the present invention. In FIGS. 1(a) and 1(b), the same reference numbers designate the same or corresponding portions as those shown in FIG. 3(a).

The crystal growth method of this embodiment will be described.

In the MOCVD method, epitaxial growth with only TMG supplied is carried out so that only Ga as a III group element is two-dimensionally arranged in only one atomic layer thickness on a GaAs substrate thereby covering the substrate surface with Ga atoms of one atomic layer thickness. Thereafter only $AsH_3$ is supplied to cover the surface of Ga atoms with As of one atomic layer thickness. These processes are repeated as is generally known.

In a crystal growth that utilizes this method and uses Ga 2 and As S as main components as shown in FIG. 1(a), in order to substitute Si 4 as an amphoteric impurity for only Ga 2 as III group element and in order to make Si 4 act as a donor, that is, n type impurity, respective elements are supplied alternately in a combination of (Ga+Si) and As, thereby carring out atomic layer epitaxy.

In FIG. 1(b), in order to make Si 4 act as an acceptor, that is, p type impurity, respective elements are supplied alternately in combination of Ga and (As+Si), thereby carrying out atomic layer epitaxy. In any of these cases, since the carrier concentration is controlled in a range of $10^{16}$ to $10^{19}$ cm$^{-3}$, the amount of Si atom 4 should be approximately $10^{-4}$ to $10^{-1}$ % of the amount of Ga atom 2 and As atom 3.

Figure 2A:
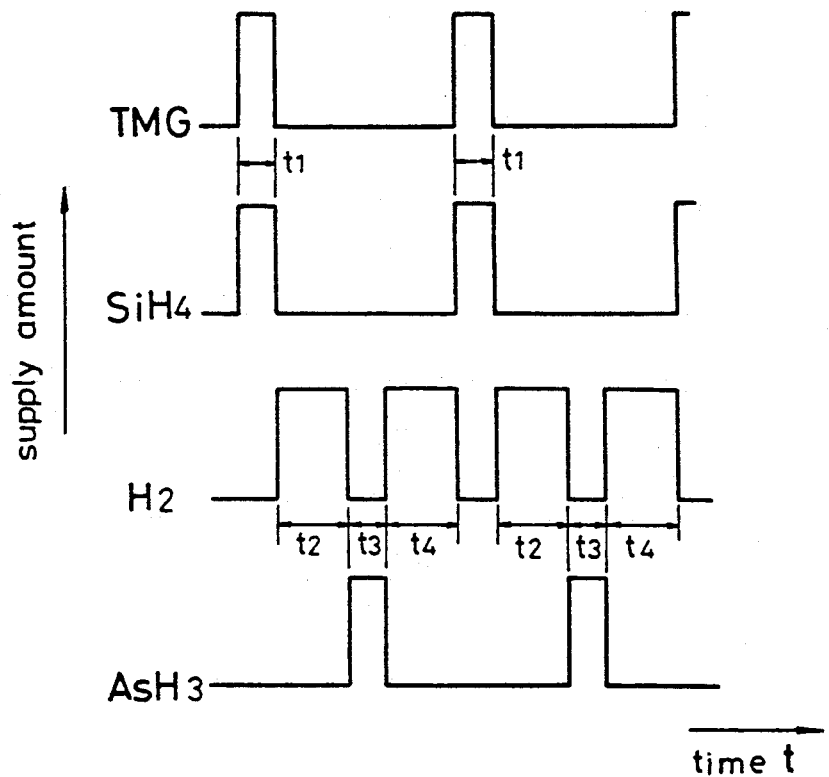
FIGS. 2(a) and 2(b) are diagrams for explaining a crystal growth sequence in the crystal growth method of the above-described embodiment.
Figure 2B:
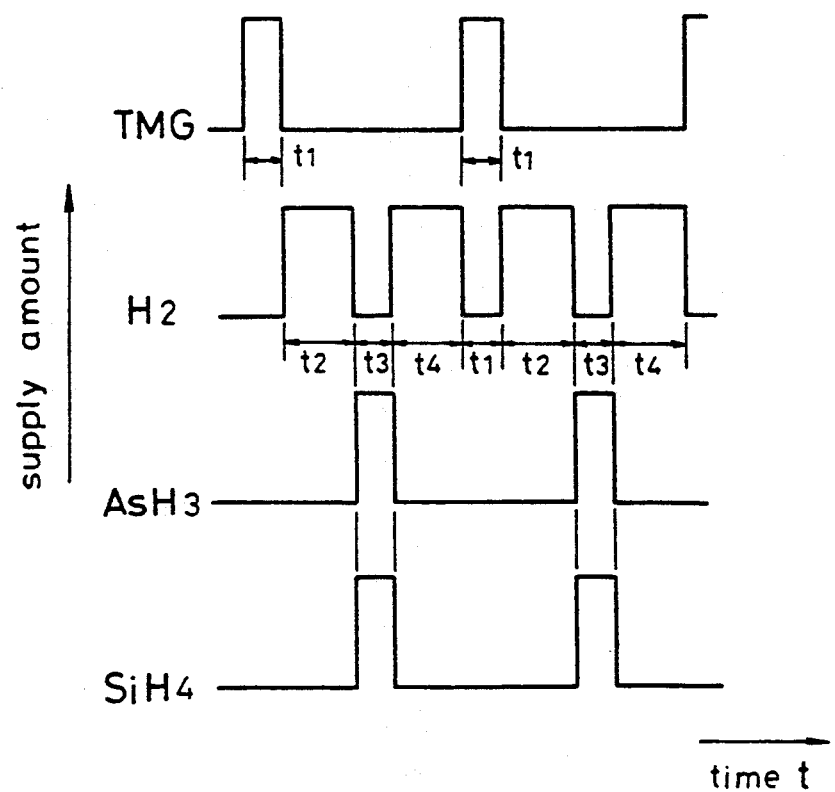

FIGS. 2(a) and 2(b) show a material supply sequence carrying out the crystal growth shown in FIGS. 1(a) and 1(b). FIG. 2(a) shows the sequence for obtaining n type GaAs in which TMG and $SiH_4$ are introduced into a reaction furnace for time $t_1$ to be thermally decomposed and Si is doped into Ga atoms. Herein, the time $t_1$ is the time during which Ga and Si atoms are arranged in one atomic layer. Subsequently, the reaction furnace is purged with H$_2$ gas for time t$_2$ and the remaining Ga and Si are removed. Thereafter, AsH$_3$ is introduced for time t$_3$ and thermally decomposed to cover the surface of the atomic layer comprising Ga and Si atoms produced as above, with As in one atomic layer.

By repeating the above-described sequence, Si as amphoteric impurity is selectively substituted for Ga at the lattice position of Ga as III group element, thereby resulting in an n type GaAs semiconductor.

As shown in FIG. 2(b), TMG produces one atomic layer and the furnace is purged with H$_2$ gas, and AsH$_3$ and SiH$_4$ are introduced into the reaction furnace at the same time. These sequences are repeatedly carried out, thereby selectively substituting Si for As as a V group element, thereby resulting in p type GaAs semiconductor.

The reaction furnace pressure may be either normal pressure or reduced pressure in the above-described embodiment, and the growth temperature is a range of 300° to 600° C., thereby resulting in high controllability of epitaxial growth.

In the above-illustrated embodiment, a process of doping with a IV group element comprises a process of epitaxially growing one atomic layer of IV group element Si as an amphoteric impurity and one of the III group element Ga and the V group element As and a process of epitaxially growing one atomic layer of the other of the III group element Ga and the V group element As. Therefore, the lattice position in the crystal into which IV group element Si as an amphoteric impurity is placed can be selectively and arbitrarily controlled to the III group element side Ga or to the V group element side As, whereby the production of n or p type conductivity is reliably controlled.

In the above-illustrated embodiment, Ga and As are used as main elements and Si is doped, however, the impurity to be used is not restricted thereto. For example, Ge can be used as dopant impurity.

Furthermore, III-V group compounds such as InP or AlAs other than GaAs can be used.

Furthermore, a ternary mixed crystal such as AlGaAs or quaternary mixed crystal such as AlGaInAs can be used.

As is evident from the foregoing description, according to the present invention, the process of doping with a IV group element as an amphoteric impurity in a III-V group compound semiconductor by MOCVD comprises a process of epitaxially growing one atomic layer of IV group element and one of a III group element and a V group element and a process of epitaxially growing one atomic layer of the other of the III group element and the V group element, whereby the IV group element as an amphoteric impurity can be selectively and arbitrarily doped as a substituent for only the III group or V group element whereby control of n type conductivity type or p type conductivity type can be reliably.

What is claimed is:

1. A method of growing a p-type III–V compound semiconductor in a metal organic chemical deposition process in which a gaseous compound including the group III element of the compound semiconductor and a gaseous compound including the group V element of the compound semiconductor are supplied independently comprising alternatingly epitaxially growing at a temperature of 300° C. to 600° C. one atomic layer including a group IV amphoteric dopant element and a group V element and epitaxially growing one atomic layer of said group III element.

2. A crystal growth method as defined in claim 1 wherein said III–V compound semiconductor is GaAs.

3. A crystal growth method as defined in claim 1 wherein said III–V compound semiconductor is InP.

4. A crystal growth method as defined in claim 1 wherein said III–V compound semiconductor is AlAs.

5. A crystal growth method as defined in claim 1 wherein said III–V compound semiconductor is AlGaAs.

6. A crystal growth method as defined in claim 1 wherein said III–V compound semiconductor is AlGaInAs.

7. A method of epitaxially growing an p-type III–V compound semiconductor containing a group IV dopant element comprising, at a temperature of 300° C. to 600° C., sequentially and repeatedly decomposing a mixture of gaseous compounds including a gaseous compound containing a group V element and a gaseous compound containing a group IV element to deposit a mixed monatomic layer of group V and group IV atoms and decomposing a gaseous compound containing a group III element to deposit a monatomic layer of group III atoms.

8. The method of claim 7 wherein the gaseous group III, group IV, and group V compounds are trimethylgallium, silane, and arsine, respectively.

9. The method of claim 7 including flowing hydrogen over each deposited monatomic layer before depositing the next monatomic layer.

* * * * *